United States Patent [19]

Brown et al.

[11] 3,996,514
[45] Dec. 7, 1976

[54] CIRCUIT BOARD CONTACT RESISTANCE PROBE

[75] Inventors: Vernon Letchworth Brown, Boulder; Leo Carrillo, Denver; Nawal Kishore Sharma, Broomfield, all of Colo.

[73] Assignee: Bell Telephone Laboratories, Incorporated, Murray Hill, N.J.

[22] Filed: Nov. 21, 1975

[21] Appl. No.: 634,254

[52] U.S. Cl. .................. 324/62; 324/28 C R; 324/158 P
[51] Int. Cl.² ................................ G01R 27/02
[58] Field of Search ...... 324/62, 64, 28 CR, 158 P, 324/73 PC

[56] References Cited
UNITED STATES PATENTS

| | | | |
|---|---|---|---|
| 3,335,365 | 8/1967 | Libhart | 324/64 |
| 3,417,323 | 12/1968 | Williamson | 324/28 CR |

OTHER PUBLICATIONS

Diode Testing, Electromechanical Design, Sept. 1961, pp. 24 & 26.
Smith, Probe for Testing Memory Plane, IBM Technical Disclosure Bulletin, Apr. 1966, pp. 1478, 1479.

*Primary Examiner*—Stanley T. Krawczewicz
*Attorney, Agent, or Firm*—John W. Fisher

[57] ABSTRACT

Measurement of the contact resistance between printed circuit patterns on a circuit board and contacts within a circuit board connector is facilitated by apparatus for gaining access to the measurement points without disruption of the electrical connections between the circuit board and the connector. The apparatus includes an electrically insulated handle to which is affixed a pair of finger probes and a pair of length-adjustable pogo probes. The finger probes engage a conductor finger on the circuit board and make electrical contact therewith. Correspondingly, the pogo probes engage a contact within the connector and make electrical contact with it. Application of a known constant current through one finger and one pogo probe and measurement of the voltage appearing between the other finger and pogo probe yields the contact resistance between the conductor finger and the connector contact without disruption of the electrical connection therebetween.

10 Claims, 6 Drawing Figures

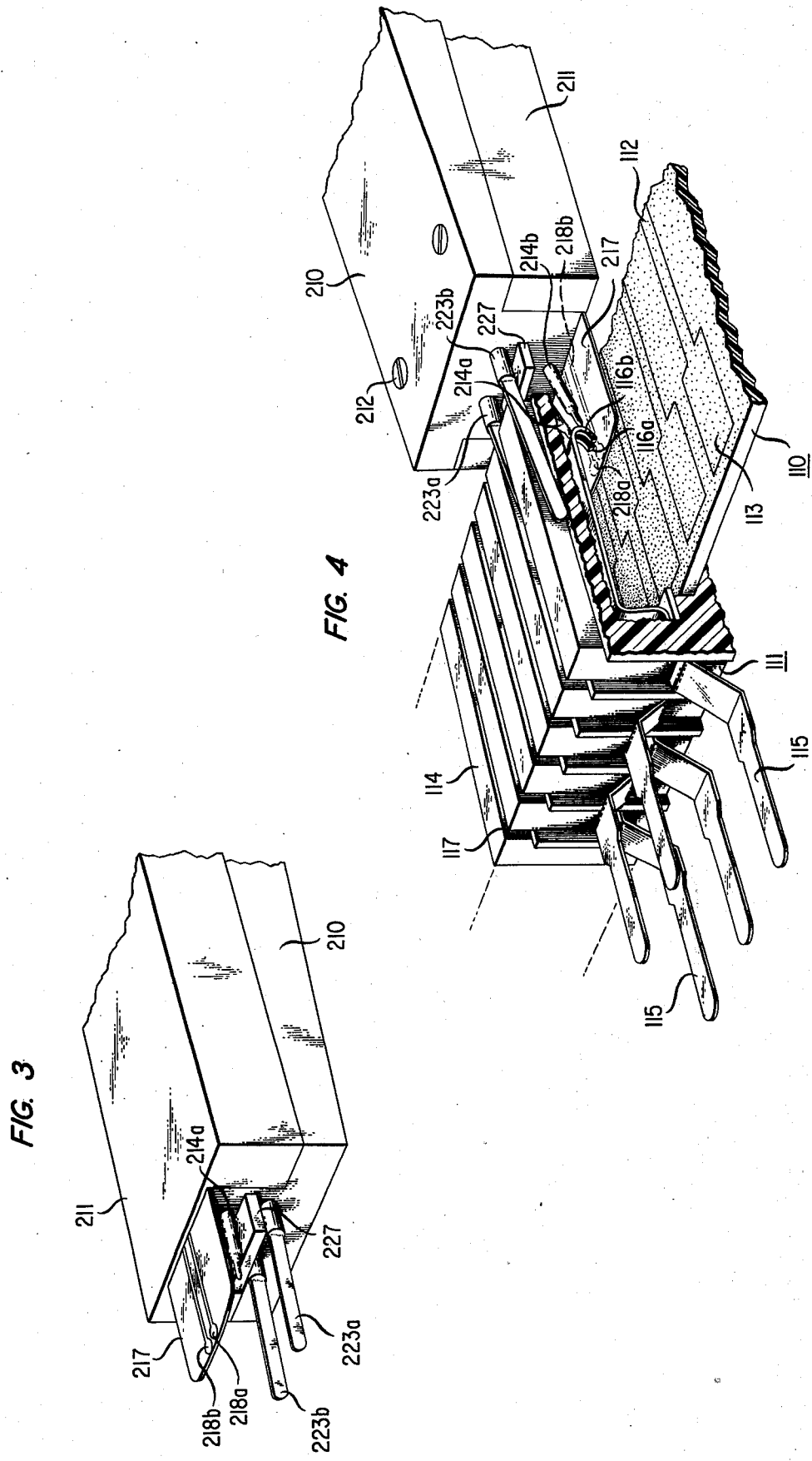

CIRCUIT BOARD CONTACT RESISTANCE PROBE

Background of the Invention

1. Field of the Invention

This invention relates to apparatus for facilitating the measurement of contact resistance and, in particular, to apparatus for facilitating such a measurement without disruption of the connection between a circuit board contact and a connector contact element.

2. Description of the Prior Art

In many instances, where a circuit fabricated on a printed circuit board is connected to other circuits through a circuit board connector, the circuit may fail to operate. The operational failure may result from a fault in the circuit itself. However, quite often, the circuit failure results from a poor connection or no connection at all between contacts on the printed circuit board and corresponding contacts in the connector. This latter type of circuit failure arises either because dirt or other particulate matter is present on the contacting surfaces or because corrosion or film formation on the contacting surfaces has occurred so that the surfaces fail to make electrical connection with one another. Locating circuit failures caused by conditions such as those just described is extremely difficult.

The reason for this difficulty is that removal of the circuit board may temporarily clear the offending condition. For example, if the circuit failure is caused by corrosion of the contacting surfaces, removal of the board may clear away enough of the corrosion so that electrical contact is again established between the circuit board and the connector when the former is inserted back into the latter. Consequently, it is extremely important from a circuit trouble-shooting point of view to be able to measure the amount of contact resistance without having to break the connection between the circuit board and the connector to gain access to the measurement points.

One method of ascertaining the efficiency of a circuit connection is disclosed in U.S. Pat. No. 3,335,365 issued to R. F. Libhart on Aug. 8, 1967. The measurement technique used by Libhart is the so-called four point contact resistance measurement. In this measurement technique, a known constant current is delivered to two outer points of a contact area and the voltage is measured between two inner points of the same contact area. With the voltage and the current known the contact resistance may be readily ascertained.

A difficulty with Libhart's approach is that sufficient space must be available in order to gain access to the measurement points. Adequate space is needed since the connections are made either by solder joints or crimped connections. It is extrememly difficult to make these kinds of connections where a circuit baord is mated with a connector and the connection is to be maintained during the measurement interval in order to guard against the possibility of temporarily clearing the problems previously described.

Other four point resistance measurement apparatus and techniques such as those suggested by J. B. P. Williamson in U.S. Pat. No. 3,417,323 issued Dec. 17, 1968 and in an article entitled "Diode Testing" appearing in Electromechanical Design dated Sept. 1961 at pages 24 and 26, have offered no solution to the access problem described above.

Accordingly, it is one object of the present invention to enable the detection of a faulty connection between a circuit board contact and a connector contact element.

Another object is to detect a faulty connection between a circuit board contact and a connector contact element while the two remain in connection with one another.

A further object of the present invention is to reduce the amount of space needed to gain access to the measurement points.

Still a further object is to simplify the procedure for effecting a contact resistance measurement.

Yet another object of the present invention is to reduce the amount of time needed to effect a contact resistance measurement.

Summary of the Invention

The foregoing and other objects of the invention are realized in an illustrative embodiment of an apparatus for facilitating the measurement of contact resistance between a circuit board having conductor fingers thereon and a connector having contact elements therein. The apparatus includes first means for making first and second electrical connections with one of the contact elements in the connector while that connector contact element remains in contact with one of the conductor fingers on the circuit board. Second means are included for making first and second electrical connections to one of the conductor fingers on the circuit board while that conductor finger remains in contact with a contact element in the connector. Additional means are provided for holding the first and second means in a predetermined spatial relationship with respect to one another.

Accordingly, it is one feature of the present invention that the contact resistance between a conductor finger on a printed circuit board and a contact element in a connector can be advantageously determined while the two points remain in contact with one another.

Another feature is that the apparatus includes means for ensuring its alignment with the contact areas to be measured.

A further feature of the present invention is that the first means for making the electrical connections with a connector contact element are adjustable in length.

Still another feature is that the insertion of the first and second means for making the electrical connections to the connector contact element and the circuit board conductor finger, respectively, is limited in extent to prevent damage to the contact areas.

Brief Descriptin of the Drawing

The aforementioned objects and features of the invention well as other objects and features will be better understood upon a consideration of the following detailed description and the appended claims in connection with the attached drawings of an illustrative embodiment in which:

FIG. 3 is an assembled view of a front portion of the contact resistance measurement probe;

FIG. 4 illustrates the insertion of the measurement probe between the circuit board and the connector contacts;

Detailed Description

Figure 1:
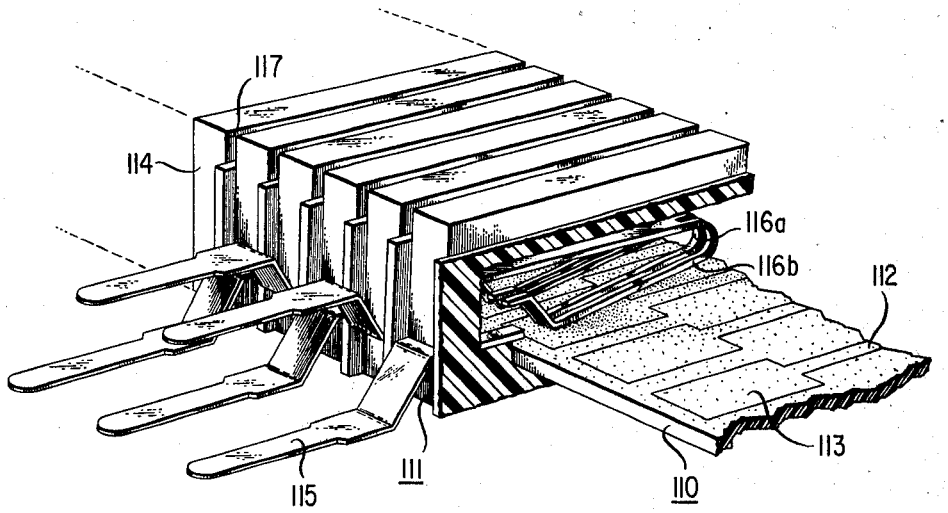
FIG. 1 is a cut-away view of a circuit board and a connector which are mated to make electrical contact with one another.

FIG. 1 illustrates a cut-away view of a printed circuit board 110 mated with a connector 111. The printed circuit board 110 includes a number of printed circuit paths 112 each of which terminates near the edge of the board 110 in a conductor finger 113. Connector 111 is comprised of an insulative body 114 into which is inserted a plurality of connector contact elements 115. Each of the contact elements 115 is partially split to define a bifurcated pair of contacts 116a and 116b. A plurality of slots 117 are included on the top and bottom surfaces of insulative body 114. These slots 117 are parallel with the contact elements 115 and are positioned to form separations between adjacent contact elements 115.

When the printed circuit board 110 is inserted into the connector 111, the conductor fingers 113 on the printed circuit board 110 engage the contact elements 115 to complete the electrical connections between the board 110 and the connector 111. It is at this point in the circuit that the contact resistance is to be measured.

The measurement of the contact resistance between the bifurcated pair of contacts 116a and 116b and one of the conductor fingers 113 may be advantageously implemented by applying a known constant current through the contact and then measuring the potential difference across the contact. This measurement technique is known in the prior art, noted above, as the four point contact resistance measurement technique.

Figure 2:
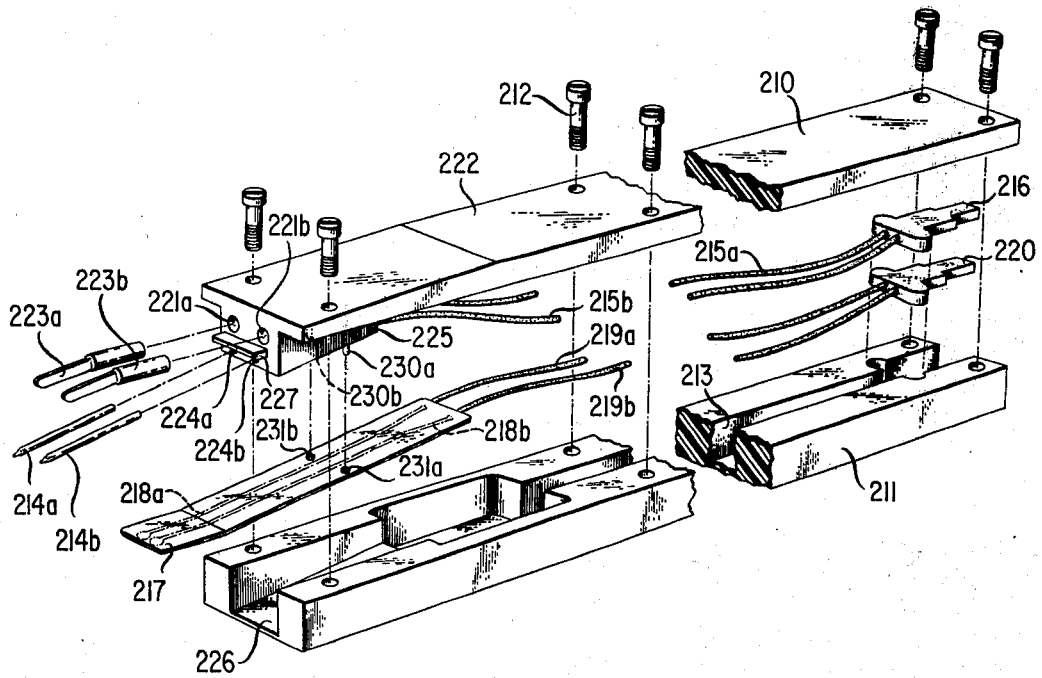
FIG. 2 is an exploded view of the contact resistance measurement probe.

Apparatus for gaining access to the mated assembly of the circuit board 110 and the connector 111 to effect the measurement of contact resistance therebetween is shown in an exploded view in FIG. 2 and in an assembled view in FIG. 3. The apparatus includes an upper handle member 210 and a lower handle member 211 both of which are fabricated from any of the well-known types of electrically insulative material such as plastic, mica or the like. In the assembled apparatus upper member 210 is fastened to lower handle member 211 by screws 212.

A pair of electrical connections with the bifurcated contacts 116a and 116b in connector 111 are implemented by a pair of pogo probes 214a and 214b. Probes 214a and 214b lie in a plane parallel with a plane containing contacting surfaces on the bifurcated contacts 116a and 116b and are spaced apart from one another approximately the same distance as are the contacts 116a and 116b. The probes 214a and 214b are of a spring loaded type such as a Model P-2663-1C probe manufactured by the Pylon Company. As a result of the spring loading, the probes 214a and 214b are adjustable in length. This length adjustment capability accomodates any possible depth variations between the contacts 116a and 116b. The probes 214a and 214b are force-fitted into a pair of cylindrical apertures 224a and 224b, respectively, which are drilled into a tapered head member 225 on upper handle member 210.

It should be noted that the probes 214a and 214b are canted with a slight downward angle with respect to a top surface 222 of upper handle member 210. This downward cant facilitates the completion of the electrical connections between the probes 214a and 214b and the contacts 116a and 116b, respectively, when the printed circuit board 110 and the connector 111 are mated with each other.

Access to the conductor fingers 113 is gained by a pair of finger probes 218a and 218b, more clearly shown in FIG. 3, which are affixed to a support member 217. In the preferred embodiment the support member 217 is comprised of a semirigid steel plate to which is bonded a printed circuit fabricated on a thin, flexible, dielectric substrate material (not shown). The finger probes 218a and 218b are printed on the flexible circuit. The support member 217 is rigidly held in place between the upper handle member 210 and the lower handle member 211 by a pair of alignment pins 230a and 230b. Alignment pins 230a and 230b are affixed to the tapered head member 225 and engage a pair of apertures 231a and 231b in support member 217. The tapered head member 225, with the support member 217 aligned thereon, engages a correspondingly tapered slot 226 in lower handle member 211 with the support member 217 between the head member 225 and the slot 226.

It should be noted that the head member 225 decreases in thickness from a front edge of the upper handle member 210 to an interior portion thereof and that the slot 226 correspondingly decreases in depth from a front edge of the lower handle member 211 to a comparable interior portion as on the upper handle member 210.

The known constant current used in the implementation of the four point contact resistance measurement is delivered to the bifurcated contact 116a and the mating finger 113 by the probes 214a and 218a, respectively. This current is supplied by a current source (not shown) and is fed via leads 215a and 219a and two-pin plugs 216 and 220. The voltage drop is measured across the bifurcated contact 116b and the mating finger 113 by the probes 214b and 218b via leads 215b and 219b and the two-pin plugs 216 and 220.

Plug 220 and leads 219a and 219b are housed in a cavity 213 in the lower handle member 211. Plug 216 and leads 215a and 215b are housed in a corresponding cavity in the upper handle member 210.

When the apparatus is inserted into the space between the connector 111 and printed circuit board 110, the finger probes 218a and 218b make contact with one of the conductor fingers 113 on the printed circuit board 110 and the probes 214a and 214b make contact with the bifurcated contact 116a and 116b in connector 111. It should be recalled that these electrical connections are to be effected while the connector 111 and the printed circuit board 110 remain in electrical contact with one another. By implementing the connections in this manner any problems in the contact connection can be advantageously ascertained without having to physically separate the two measurement points and possibly clear any contact difficulties which may exist.

Alignment of the measurement apparatus with the connector and finger contact points where the contact resistance measurement is to be made is effected by a pair of guide pins 223a and 223b. The guide pins 223a and 223b engage a pair of adjacent slots 117 in insulative body 114, as shown in FIG. 4, to ensure the proper alignment of the probes 214a and 214b with the bifurcated contacts 116a and 116b and the finger probes 218a and 218b with the conductor finger 113. The guide pins 223a and 223b are affixed to upper handle member 210 by force-fitting them into a pair of cylindrical apertures 221a and 221b, respectively, which have been drilled into the tapered head member 225. Similar to the slight downward cant imparted to the probes 214a and 214b, the guide pins 223a and 223b are also mounted with a slight downward cant with respect to the top surface 222 of upper handle member 210. This downward cant facilitates the insertion of the apparatus into the space between the mated connector 111 and circuit board 110 without having to disturb any existing electrical connections therebetween.

Figure 5:
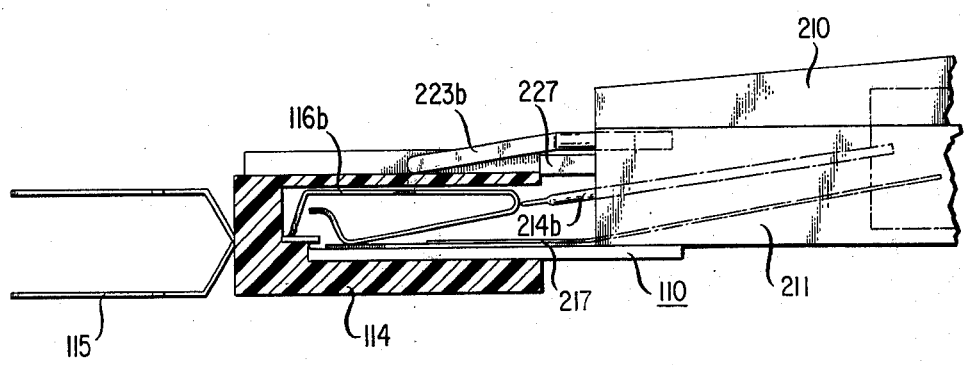
FIG. 5 is a side view of the measurement probe when inserted between the circuit board and connector contacts.

The depth of insertion of the apparatus into the established connection between the circuit board 110 and the connector 111 is limited by a bumper 227. This limitation on the depth of insertion is more clearly shown in FIG. 5. In addition, the side view of FIG. 5 clearly shows the effect of the slight downward cant imparted to the guide pins 223a and 223b and the probes 214a and 214b. As the apparatus is inserted almost horizontally into the established connection between the circuit board 110 and the connector 111, the slight downward cant of the guide pins 223a and 223b ensures that they will positively engage the slots 117 in insulative body 114 and thereby properly align the probes 214a and 214b and finger probes 218a and 218b with the bifurcated contacts 116a and 116b and the conductor finger 113, respectively. Also the slight downward cant of probes 214a and 214b ensures that they will clear the inside top edge of the insulative body 114 and thereby make contact with the bifurcated contacts 116a and 116b.

Figure 6:
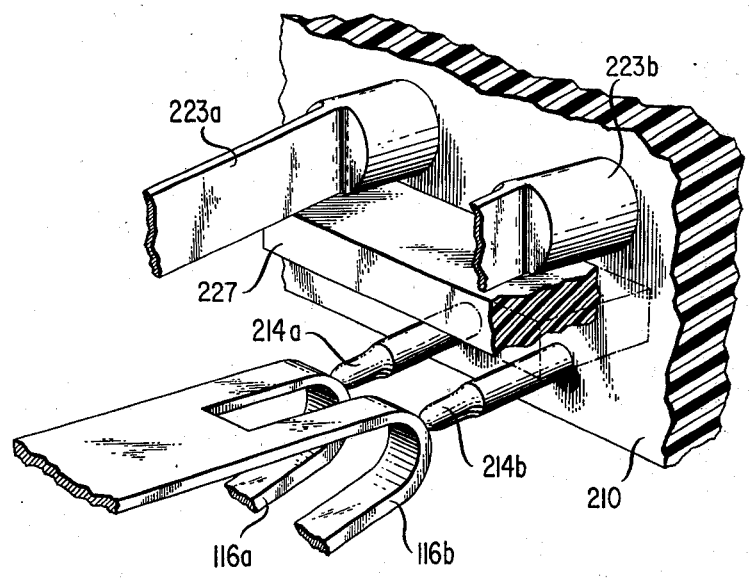
FIG. 6 is a partial detailed view of the connection between a connector contact element and the length adjustable pogo probes on the measurement probe.

The effectuation of the electrical connection between the probes 214a and 214b and the bifurcated contacts 116a and 116b is somewhat more clearly shown in FIG. 6. As illustrated, a tip of probe 214a makes a pressure connection with the contact 116a while a similar pressure connection is established between a tip of probe 214b and contact 116b.

In summary, an apparatus has been described for gaining access to a mated connection between a printed circuit board 110 and a connector 111, without having to physically separate the two. Once access to the mated connection is obtained, a contact resistance measurement can be advantageously made while the circuit board 110 and connector 111 remain connected to one another.

In all cases it is to be understood that the above-described embodiment is illustrative of but a small number of many possible specific embodiments which can represent applications of the principles of the invention. Thus, numerous and various other embodiments can readily be devised in accordance with these principles by those skilled in the art without departing from the spirit and scope of the invention.

What is claimed is:

1. Apparatus for facilitating the measurement of contact resistance between a circuit board having conductor fingers thereon and a connector having contact elements therein, said apparatus including
   first means for making first and second electrical connections with one of said contact elements in said connector while said one connector contact element remains in contact with one of said conductor fingers on said circuit board, second means for making first and second electrical connections to one of said conductor fingers on said circuit board while said one conductor finger remains in contact with said one contact element in said connector, and
   means for holding said first and second means in a predetermined spatial relationship with respect to one another.

2. The apparatus in accordance with claim 1 wherein said first means includes
   first and second probes separated by a predetermined distance and lying in a plane parallel with a plane containing contacting surfaces of said connector contact elements, and
   means, included in said probes, for controlling the length thereof.

3. The apparatus in accordance with claim 2 further including
   an upper handle member,
   a lower handle member,
   means for coupling an electric voltage from said first probe and an electric current to said second probe,
   means, included in said upper and lower handle members, for internally housing said coupling means, and
   means for securing said upper handle member to said lower handle member.

4. The apparatus in accordance with claim 3 wherein said coupling means includes
   a plug having first and second connector pins therein, and
   first and second leads for connecting said first and second connector pins to said first and second probes.

5. The apparatus in accordance with claim 1 wherein said second means includes
   a support member,
   first and second electrically conductive members affixed to said support member, said conductive members being separated from one another by a predetermined distance, and
   means for securing said support member to said holding means such that said support member is between said conductive members and said first means.

6. The apparatus in accordance with claim 5 wherein said means for securing said support member to said holding means includes
   an upper handle member having integral therewith on its underside a head member, said head member decreasing in thickness from a front edge of said upper handle member to an interior portion thereof,
   a lower handle member having integral therewith a tapered slot, said slot decreasing in depth from a front edge of said lower handle member to an interior portion thereof, said decreasing slot depth corresponding to said decreasing thickness of said head member,
   first and second alignment pins affixed to said head member,
   means, included in said support member, for engaging said first and second alignment pins, and
   means for securing said upper handle member to said lower handle member.

7. The apparatus in accordance with claim 6 further including
   means for coupling an electrical current from said first electrically conductive member and an electric voltage from said second electrically conductive member, and
   means, included in said lower handle member, for internally housing said coupling means.

8. The apparatus in accordance with claim 7 wherein said coupling means includes
   a plug having first and second connector pins therein, and
   first and second leads for connecting said first and second connector pins to said first and second electrically conductive members affixed to said support member.

9. The apparatus in accordance with claim 1 further including
   means for ensuring the alignment of said first means with one of said contacts in said connector and said second means with one of said conductor fingers on said circuit board, and
   means for limiting the extent of insertion of said first and second means into said connection between one of said contacts in said connector and one of said conductor fingers on said circuit board.

10. The apparatus in accordance with claim 9 wherein the alignment ensuring means includes
    first and second guide pins spaced apart from one another by a predetermined distance and lying in a plane parallel with a plane containing contacting surfaces of said connector contact elements,
    means for affixing said first and second guide pins to said holding means, and
    means, included in said connector, for engaging said first and second guide pins to ensure alignment of said first and second means for making electrical connections to said one connector contact element and said one circuit board conductor finger.

* * * * *